United States Patent
Ryan et al.

(10) Patent No.: US 11,880,197 B2
(45) Date of Patent: Jan. 23, 2024

(54) VIRTUAL VEHICLE CONTROL SYSTEM

(71) Applicant: DoorDash, Inc., San Francisco, CA (US)

(72) Inventors: Lawrence Oliver Ryan, Menlo Park, CA (US); Usman Ghani, Pacifica, CA (US); Tobenna Arodigobu, San Francisco, CA (US)

(73) Assignee: DoorDash, Inc., San Francisco, CA (US)

( * ) Notice: Subject to any disclaimer, the term of this patent is extended or adjusted under 35 U.S.C. 154(b) by 302 days.

(21) Appl. No.: 17/482,088

(22) Filed: Sep. 22, 2021

(65) Prior Publication Data

US 2022/0004188 A1    Jan. 6, 2022

Related U.S. Application Data

(63) Continuation of application No. 16/402,619, filed on May 3, 2019, now Pat. No. 11,175,654.
(Continued)

(51) Int. Cl.
*G05D 1/00* (2006.01)
*H04W 4/40* (2018.01)
(Continued)

(52) U.S. Cl.
CPC .......... *G05D 1/0022* (2013.01); *G05D 1/0016* (2013.01); *G06T 15/08* (2013.01);
(Continued)

(58) Field of Classification Search
CPC .. G05D 1/0022; G05D 1/0016; G05D 1/0231; G05D 1/0255; G05D 1/0257; G05D 1/0038; G06T 15/08; H03M 13/1515; H03M 13/154; H03M 13/6312; H04L 69/16; H04L 69/04; H04L 67/12;
(Continued)

(56) References Cited

U.S. PATENT DOCUMENTS

| | | | |
|---|---|---|---|
| 5,850,352 A | 12/1998 | Moezzi et al. | |
| 6,028,537 A | 2/2000 | Suman et al. | |

(Continued)

FOREIGN PATENT DOCUMENTS

WO    2019213497 A1    11/2019

OTHER PUBLICATIONS

U.S. Appl. No. 16/402,619, Notice of Allowance dated Jun. 25, 2021, 5 pgs.
(Continued)

*Primary Examiner* — Bhavesh V Amin
(74) *Attorney, Agent, or Firm* — Kwan & Olynick LLP

(57) ABSTRACT

A remote vehicle control system includes a vehicle mounted sensor system including a video camera system for producing video data and a distance mapping sensor system for producing distance map data. A data handling system is used to compress and transmit both the video and distance map data over a cellular network using feed forward correction. A virtual control system acts to receive the video and distance map data, while providing a user with a live video stream supported by distance map data. Based on user actions, control instructions can be sent to the vehicle mounted sensor system and the remote vehicle over the cellular network.

20 Claims, 2 Drawing Sheets

Related U.S. Application Data

(60) Provisional application No. 62/666,566, filed on May 3, 2018.

(51) Int. Cl.

| | | |
|---|---|---|
| *H04N 19/46* | (2014.01) | |
| *G06T 15/08* | (2011.01) | |
| *H03M 13/00* | (2006.01) | |
| *H03M 13/15* | (2006.01) | |
| *H04L 69/16* | (2022.01) | |
| *H04N 23/698* | (2023.01) | |
| *H04W 84/04* | (2009.01) | |
| *G05D 1/02* | (2020.01) | |

(52) U.S. Cl.
CPC ..... *H03M 13/154* (2013.01); *H03M 13/1515* (2013.01); *H03M 13/6312* (2013.01); *H04L 69/16* (2013.01); *H04N 19/46* (2014.11); *H04N 23/698* (2023.01); *H04W 4/40* (2018.02); *G05D 1/0231* (2013.01); *G05D 1/0255* (2013.01); *G05D 1/0257* (2013.01); *H04W 84/042* (2013.01)

(58) Field of Classification Search
CPC .... H04L 67/125; H04N 19/46; H04N 23/698; H04N 7/185; H04W 4/40; H04W 84/042; H04W 4/38
See application file for complete search history.

(56) References Cited

U.S. PATENT DOCUMENTS

| | | | |
|---|---|---|---|
| 6,236,365 B1 | 5/2001 | LeBlanc et al. | |
| 6,317,462 B1 | 11/2001 | Boyce | |
| 6,611,755 B1 | 8/2003 | Coffee et al. | |
| 6,781,513 B1 | 8/2004 | Korkosz et al. | |
| 7,664,109 B2 | 2/2010 | Li | |
| 7,672,639 B2 | 3/2010 | Vaddiparty et al. | |
| 8,340,902 B1 | 12/2012 | Chiang | |
| 8,385,821 B2 | 2/2013 | Rhodes et al. | |
| 8,418,039 B2 | 4/2013 | Birmingham et al. | |
| 8,520,695 B1 | 8/2013 | Rubin et al. | |
| 8,754,804 B1 | 6/2014 | Sims et al. | |
| 9,123,186 B2 | 9/2015 | Ricci | |
| 9,465,388 B1 | 10/2016 | Fairfield et al. | |
| 11,175,654 B2 | 11/2021 | Ryan et al. | |
| 2002/0047900 A1 | 4/2002 | Nishiyama et al. | |
| 2003/0065805 A1 | 4/2003 | Barnes | |
| 2003/0080878 A1* | 5/2003 | Kirmuss | G11B 27/36 348/E7.086 |
| 2003/0081121 A1* | 5/2003 | Kirmuss | B60R 11/02 348/E7.086 |
| 2003/0081122 A1* | 5/2003 | Kirmuss | G07C 5/0891 348/E7.086 |
| 2003/0081127 A1* | 5/2003 | Kirmuss | G11B 27/36 348/E7.086 |
| 2003/0081934 A1* | 5/2003 | Kirmuss | B60R 11/02 348/E7.086 |
| 2003/0081935 A1* | 5/2003 | Kirmuss | H04N 7/18 386/327 |
| 2003/0095688 A1* | 5/2003 | Kirmuss | G08B 13/19695 348/E7.086 |
| 2003/0117297 A1* | 6/2003 | Obradovich | G09B 29/106 340/905 |
| 2005/0085242 A1 | 4/2005 | Nishizawa | |
| 2007/0087756 A1* | 4/2007 | Hoffberg | G06Q 10/06375 455/450 |
| 2008/0134258 A1 | 6/2008 | Goose et al. | |
| 2009/0195655 A1 | 8/2009 | Pandey | |
| 2010/0039494 A1 | 2/2010 | Horihata et al. | |
| 2010/0201819 A1 | 8/2010 | Minowa | |
| 2012/0095619 A1 | 4/2012 | Pack et al. | |
| 2013/0145482 A1 | 6/2013 | Ricci et al. | |
| 2013/0155231 A1 | 6/2013 | Ohayon et al. | |
| 2013/0198802 A1 | 8/2013 | Ricci | |
| 2013/0332004 A1 | 12/2013 | Gompert et al. | |
| 2014/0002651 A1 | 1/2014 | Plante | |
| 2014/0212142 A1 | 7/2014 | Doniec et al. | |
| 2014/0279707 A1 | 9/2014 | Joshua et al. | |
| 2014/0310739 A1 | 10/2014 | Ricci et al. | |
| 2015/0185034 A1 | 7/2015 | Abhyanker | |
| 2015/0248131 A1 | 9/2015 | Fairfield et al. | |
| 2015/0302737 A1 | 10/2015 | Geerlings et al. | |
| 2015/0348336 A1 | 12/2015 | Kim et al. | |
| 2016/0006922 A1 | 1/2016 | Boudreau et al. | |
| 2016/0057335 A1 | 2/2016 | Pisz | |
| 2016/0283804 A1 | 9/2016 | Furman et al. | |
| 2016/0305794 A1 | 10/2016 | Horita et al. | |
| 2017/0178352 A1 | 6/2017 | Harmsen et al. | |
| 2017/0243485 A1 | 8/2017 | Rubin et al. | |
| 2017/0263120 A1 | 9/2017 | Durie, Jr. et al. | |
| 2018/0020183 A1 | 1/2018 | Andreev | |
| 2019/0011910 A1 | 1/2019 | Lockwood et al. | |
| 2019/0011912 A1 | 1/2019 | Lockwood et al. | |
| 2019/0012908 A1 | 1/2019 | Chun et al. | |
| 2019/0045244 A1 | 2/2019 | Balakrishnan et al. | |
| 2019/0176862 A1* | 6/2019 | Kumar | B61L 15/0081 |
| 2019/0221052 A1 | 7/2019 | Kitazawa et al. | |
| 2019/0339689 A1 | 11/2019 | Ryan et al. | |
| 2020/0294401 A1* | 9/2020 | Kerecsen | G05D 1/0287 |
| 2021/0329306 A1* | 10/2021 | Liu | G06V 40/168 |

OTHER PUBLICATIONS

International Application Serial No. PCT/US19/30566, Preliminary Report on Patentability dated Nov. 12, 2020; 11 pgs.

International Application Serial No. PCT/US19/30566, Written Opinion of the International Searching Authority dated Jul. 15, 2019; 9 pgs.

Khaled Mohsen, A Performance Analysis and Improvement of Error Correction Concatenation Fire Code Algorithm for Vehicle Telemetry System.

Zeashan Hameed Khan, Wireless Network Architecture for Long range Teleoperation of an Autonomous System.

* cited by examiner

VIRTUAL VEHICLE CONTROL SYSTEM

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

TECHNICAL FIELD

The present disclosure relates to remote vehicle control of vehicles using available cell phone networks. In one embodiment, forward error correction of video feeds is used to ensure transmission fidelity.

BACKGROUND AND SUMMARY

Remote control of autonomous or semi-autonomous vehicles using a wireless cellular communication system would be useful in many situations. For example, a remote driver could maneuver a vehicle to and from a destination while being located at a convenient location and viewing the vehicle environment through multiple displays or a virtual interface. In another application, a remote operator can oversee one or more vehicles and take direct control of the vehicle in unanticipated or dangerous situations.

Unfortunately, transmission of real-time streaming video data with the necessary low latency and quality is difficult over existing cellular wireless infrastructures. Typically, cellular networks sending data packets via an Internet protocol such as Transmission Control Protocol (TCP) or User Datagram Protocol (UDP). These data packets are forwarded to intermediary routers until arriving at a destination.

TCP guarantees that a destination will receive the packets by having the data originator provide number ordering to the data packets. The destination sends messages back to confirm packet receipt. If the originator does not get a correct response, the packets are resent to ensure receipt. Packets are also checked for errors to ensure that data is not lost or corrupted in transit. Unfortunately, while reliable, TCP protocol is too slow to provide real-time streaming video suitable for vehicle control, since packet routing delays and packet retransmit requests can prevent video transmission for multiple seconds.

To increase data transmission speed, conventional UDP protocols can be used. UDP protocols are similar to TCP protocols, but eliminate confirmation of data receipt and provide no deliverability guarantees. When using UDP protocols, packets are just sent to the destination. The originator does not wait to make sure the destination received the packet, and simply continues to send the additional data packets. There is no guarantee that the destination receives all the packets and there is no way to request resend of a data packet. While this level of data quality can be sufficient for general streaming video with buffering, the potential for intermittent loss of video data necessary for real-time remote driving applications requires an improved system.

Problems associated with remote vehicle control over a cellular network can be alleviated by use of a remote vehicle control system that includes a vehicle mounted sensor system. The sensor system can include a video camera system for producing video data and a distance mapping sensor system for producing distance map data. A data handling system is used to compress and transmit both the video and distance map data over a cellular network using feed forward correction. A virtual control system is arranged to receive the video and distance map data, provide a user with a live video stream supported by distance map data. In response to user actions, transmit control instructions can be sent to the vehicle mounted sensor system and the remote vehicle over the cellular network.

In some embodiments the video camera system includes a plurality of video cameras to provide a 360-degree video feed. The distance mapping sensor system can include at least one of a lidar system, a radar system, a stereo imaging system for distance determination, a monocular system for distance determination, and an ultrasonic sensing system.

To improve reliability, in some embodiments the data handling system can include a video prioritization module to order video data at least in part by priority. For example, the video prioritization module can interleave video frames prior to transmission, send video streams covering forward vehicle view first in priority, or send key frames with higher priority.

In one embodiment, the data handling system compresses the video data using a forward error correction module. Forward error correction can include use of maximum separable distance erasure codes such as a Cauchy Reed-Solomon code.

In one embodiment, the data handling system transmits packets by a User Datagram Protocol (UDP), with modifications to data structure and encoding/decoding used to increase reliability.

In some embodiments, the virtual control system has a voxel render module to create a distance map. Using distance data provided by a lidar or other distance determination system, the distance data can be used to construct an improved virtual view system that incorporates received video information.

In some embodiments, the virtual control system has a cubic projection viewer for virtual reality view and control.

In another embodiment, a method for controlling a remote vehicle includes the steps of providing video and distance map data from a vehicle mounted sensor system. Both the video and distance map data can be compressed and transmitted over a cellular network using feed forward correction. At a remote site the video and distance map data can be received and reconstructed to provide a user with a live video stream supported by distance map data. Control instructions to the vehicle mounted sensor system and the remote vehicle can be transmitted to the vehicle over the cellular network.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
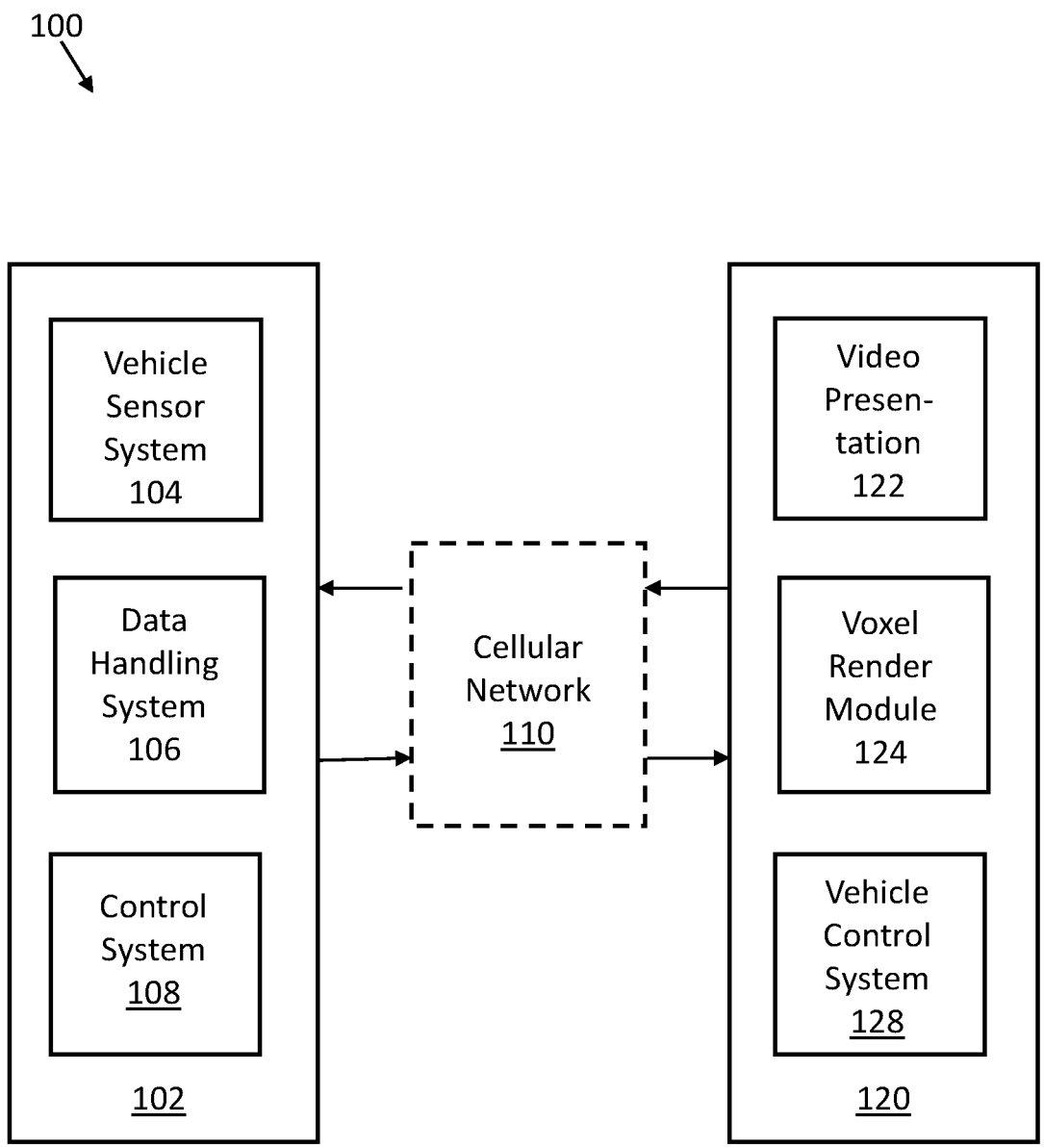
FIG. 1 illustrates various modules in a remote vehicle control system.

FIG. 1 illustrates one embodiment of a remote vehicle control system 100 that includes a vehicle mounted sensor and communication system 102. The system 102 includes a vehicle sensor system 104 that supports a video camera system for producing video data and a distance mapping sensor system for producing distance map data. The vehicle also supports a data handling system 106 providing data compression and a transmission system able to transmit the video and distance map data over a cellular phone network 110 using feed forward correction techniques. Finally, the vehicle includes an autonomous or semi-autonomous control system 108 for receiving remote vehicle control data.

Data sent via the cellular network 110 is received by a virtual control system 120. Using a video presentation module 122 and a voxel render module 124, the received video and distance map data is decoded and processed to provide a user with a virtual live video stream, supported by distance map. A vehicle control system 128 allows the user to transmit control instructions to the vehicle control system 108 and vehicle mounted sensor system 104 to provide real-time drivability and control of the remote vehicle over the cellular network 110.

As will be appreciated, while commercially available 4G and 5G cellular communication systems can support the system and described methods, any combination of single or bonded multiple links of satellite, cellular, microwave, Wi-Fi, dedicated RF channel, or any other wireless type of communication network, technologies and operators can be used. In some systems, such as those based on Coded Orthogonal Frequency Division Multiplexing (COFDM), forward error correction is applied to the signal before transmission to overcome errors in the transmission due to lost carriers from frequency selective fading, channel noise and other propagation effects.

The video camera system can include a plurality of video cameras to provide a multiple video feed of the vehicle environment and interior of the vehicle. Cameras can be mounted on the interior, front, back and sides of a vehicle. In some embodiments, cameras can be grouped into clusters, with multiple cameras pointed to provide separated and slightly overlapping fields of view. Stereo cameras can be used to provide distance measurements, and infrared, UV, or hyperspectral cameras systems can be used. Cameras can provide video frame data at a rate ranging from 10 frames per second to as much as 60 frames per second. In one embodiment, the display is configured to display a real time video and audio feed to a remote user, providing the experience of a virtual passenger to the driver in the vehicle. A three hundred sixty degree (360°) camera is situated on or inside in the vehicle A 360° image is compiled from images taken by the multiple cameras and used to form a 360° image displayed on the remote display.

The distance mapping sensor system can include a lidar system, a radar system, a stereo imaging system for distance determination, a monocular system for distance determination, and an ultrasonic sensing system. The lidar system can include multiple scanning lasers and suitable time-of-flight measurement systems to provide distance from a vehicle to another vehicle, moving object, or fixed object with sub-meter resolution. In some embodiments, imaging cameras that additionally provide time-of-flight distance data can be used.

In addition to video and distance viewing, other data can also be sent to track and monitor various vehicle attributes and the environment of the vehicle or through which it travels. For example, vehicle related data such as speedometer data, geo-positioning system (GNSS/GPS) data, accelerometer data, yaw, pitch and roll data, load weight, oil or hydraulic fluid levels, fluid temperature, exhaust data, vehicle door status, wiper blade status, and dashboard data. Internal or external environmental data including audio data, chemical sensor data (e.g. carbon monoxide levels), internal and external temperature data.

In some embodiments, the data handling system can include a video prioritization module to order video data or other data at least in part by priority. Prioritization can include use of video frame interleaving prior to transmission. In some embodiments, duplication of key views or ordering multiple video streams in order of importance (e.g. forward video views are sent first) can occur. Priorities can also be determined at a packet level, depending on their attributes such as video or telemetry data, or video packet type (such as B-frame or I-frame, or audio-frame).

In another embodiment, the data handling system compresses the video data using a forward error correction module. Forward error correction of transmitted data provided by the forward error correction module can include use of a maximum separable distance erasure code. Such an erasure code generates n encoding symbols from a set of k source symbols (k≤n). Erasure codes can be split into two categories maximum separable distance (MDS) codes and non-MDS codes. MDS codes provide that the k source symbols can be recovered from any set of k encoding symbols among the n ones.

Non-MDS codes such as Fountain codes, Raptor codes, or Low Density Parity Check (LDPC) codes can be used in some embodiments. In a typical non-MDS code, (1+e)*k symbols are needed on average to recover the k source symbols, where e>0. Other conventional non-MDS codes such as Tornado codes, IRA, or Luby Transform (LT) codes that encode with a constant number of XOR blocks can be used, as well as HoVer and WEAVER codes. Typically, these codes generate a random number between a range of numbers equal to the number of data blocks that a video frame can be partitioned into. A corresponding number of data blocks are chosen at random and combined with an XOR operation. The transmitted combination is then received and decoded using redundant information that allow data blocks reconstruction even is some data blocks are lost.

Alternatively, in other embodiments MDS codes can be constructed from Vandermonde matrices (providing, for example, Reed-Solomon codes), a Fermat Number Transform (providing, for example, FNT based Reed-Solomon codes), or from Cauchy matrices (providing, for example, Cauchy Reed-Solomon codes).

In one embodiment, the data handling system compresses the video, distance, and telemetry data using a Cauchy Reed-Solomon code. As compared to a Reed-Solomon code, a Cauchy Reed-Solomon code provides an algorithm that converts all encoding operations to XORs, so that encoding takes O(n log 2(m+n)) XORs per coding block. In addition, a Cauchy distribution matrix is used rather than the standard Vandermonde distribution matrix, to improve performance of matrix inversion for decoding. More specifically, a Cauchy Reed-Solomon code uses n data words, which are represented in a column vector D=<D1, ..., Dn>. D is multiplied by an (n+m)×n distribution matrix, with first n rows being the identity matrix. The product is an n+m-element column vector D|C, with C=<C1, ..., Cm> representing the coding words. Since the distribution matrix must have the property that all n×n submatrices are invertible, an m×n Cauchy matrix can be used, again over GF ($2^w$), where n+m≤$2^w$. An m×n Cauchy matrix is defined as follows. Let X={x1, ..., $x_m$} and Y={y1, ..., $y_n$} be defined such that each $x_i$ and $y_i$ is a distinct element of GF ($2^w$), and X∩Y=∅. Then the Cauchy matrix is defined by X and Y and has $1/(x_i+y_j)$ in element i, j. The distribution matrix can be composed of the identity matrix in the first n rows, and a Cauchy matrix in the remaining m rows with the property that all n×n submatrices are invertible. These submatrices can also be inverted in $O(n2)$ Galois operations. In another aspect that improves performance, operations over GF $(2^w)$ can be converted into XORs by having each element e of GF $(2^w)$ represented by a 1×w column vector of bits, V (e). This vector is equivalent to the standard binary representation of the element. Each element e of GF $(2^w)$ may also be represented by a w×w matrix of bits, M (e), where the i-th column of M (e) is equal to the column vector V (e2i−1). Coding packets are determined using only XOR operations. Decoding proceeds by deleting the rows of the distribution matrix that correspond to packet or other data loss failures, inverting the resulting matrix, and multiplying it by the surviving words in order to recalculate the lost data.

Advantageously, both MDS and non-MDS codes are useful for applications where, due to real time limitations, packet losses cannot be recovered by retransmission. This can include video data transmitted over cellular networks (e.g. using a Real Time Transport Protocol (RTP) carried on User Datagram Protocol (UDP) packets), multicast transmissions of multiple video feeds, or data chunks of wireless peer to peer networks (e.g. Vehicle-to-Vehicle or Vehicle-to-X networks). In one embodiment, the data handling system transmits packets by a User Datagram Protocol (UDP) with priority ordered and compressed using a Cauchy Reed-Solomon code.

The virtual control system has a voxel render module to create a distance map. To improve decode speed and render performance, in some embodiments the three dimensional distance maps created by lidar or other distance sensors that are supported by vehicle mounted sensor and communication system 102 can be compressed using a space filling curve algorithm. Such a space filling curve mapping allows mapping from a higher three-dimensional space to a lower one-dimensional space where points which are close in the higher-dimensional space map to points which are close in the one dimensional space. Advantageously, this simplifies compression and reconstruction of the distance maps. Hilbert and Hilbert-like (i.e. poly-Hilbert curves such as Neptunus and Luna curves) space filling curves can be used. In other embodiments, sweep, scan, Peano, or Gray curves can be used.

The virtual control system 100 includes the virtual reality view and control system to display decoded and reconstructed vehicle video feeds. It will be appreciated that various types of displays can be used to visualize the video and distance map data, including as a desktop computer screen, mobile electronic devices, projectors or a 3D hologram. In one embodiment, a virtual reality display, such as a head mounted device (HMD) such as an Oculus Rift virtual reality system or other headsets, Google Glass or other optical head-mounted display can be used. In some embodiments, the vehicle sensor system 104 and included cameras are configured so that movement of a remote HMD display by the remote user is sent via vehicle control system 128 and cellular network 110 to move cameras of the vehicle sensor system 104. In other embodiments, movement of HMD does not cause actual movement of the onboard camera(s), but instead results in reprioritization of video feeds (e.g. looking backward will increase priority of rear camera video feeds from the vehicle).

Various techniques for mapping multiple video feeds onto a virtual image sphere (or partial sphere) are available. For example, a cubic projection viewing system can be used, as well as viewers based on equiangular or equirectangular cubemaps, or pyramid encoding.

In some configurations, the system 100 is capable of combining virtual and augmented reality methods with real-time video and/or audio and with real-time vehicle telemetry data. This permits, for example, providing three dimensional (3D) augmented reality with dynamics virtual pointers, text, or other indicators to allow a remote user to better interact with the vehicle, while still providing real-time information.

Figure 2:
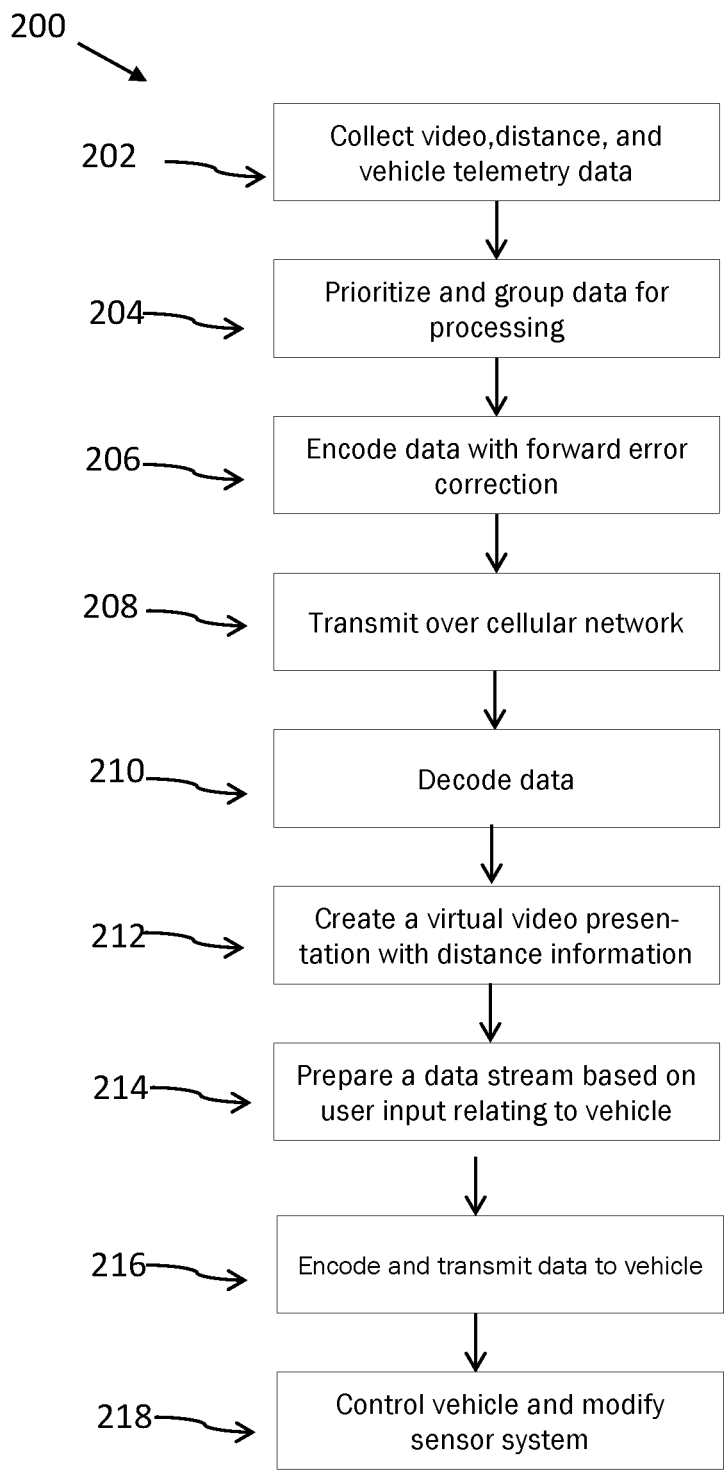
FIG. 2 illustrates one method of operating a remote vehicle control system to ensure remote real-time control of the vehicle.

FIG. 2 illustrates one embodiment of a process 200 for operating a remote vehicle control system. In a first step 202, video, distance map, and telemetry data is collected. In step 204, this data is grouped and prioritized for processing prior to transmission. In step 206, some form of forward error correction is used to increase reliability of transmitted data over a cellular network (step 208). At the destination, the data is decoded (step 210) and a virtual video presentation with distance map information is created (step 212). Based on user input from a remote user/driver, a return data stream is prepared (step 214), encoded and transmitted to the vehicle (step 216), and used to control the vehicle or modify operation of the sensor system (step 218)

In the foregoing description, reference is made to the accompanying drawings that form a part thereof, and in which is shown by way of illustration specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The foregoing detailed description is, therefore, not to be taken in a limiting sense.

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

Embodiments in accordance with the present disclosure may be embodied as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. Computer program code for carrying out operations of the present disclosure may be written in any combination of one or more programming languages. Such code may be compiled from source code to computer-readable assembly language or machine code suitable for the device or computer on which the code will be executed.

Embodiments may also be implemented in cloud computing environments. In this description and the following claims, "cloud computing" may be defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction and then scaled accordingly. A cloud model can be composed of various characteristics (e.g., on-demand self-service, broad network access, resource pooling, rapid elasticity, and measured service), service models (e.g., Software as a Service ("SaaS"), Platform as a Service ("PaaS"), and Infrastructure as a Service ("IaaS")), and deployment models (e.g., private cloud, community cloud, public cloud, and hybrid cloud).

The flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A system comprising:
   at least one processor; and
   a memory, the processor configurable to cause:
   obtaining video data via a video camera system mounted to a vehicle;
   obtaining distance map data via a distance mapping sensor system coupled to the vehicle;
   compressing the video data such that compressed video data is generated;
   compressing the distance map data using a compression algorithm such that compressed distance map data is generated;
   transmitting the compressed video data via a network to a virtual control system;
   transmitting the compressed distance map data via the network to the virtual control system;
   processing vehicle control instructions received, via the network, from the virtual control system; and
   modifying operation of the vehicle according to the vehicle control instructions.

2. The system of claim 1, the video camera system including a plurality of video cameras configurable to provide a 360-degree video feed.

3. The system of claim 1, the distance mapping sensor system comprising at least one of a lidar system, a radar system, a stereo imaging system for distance determination, a monocular system for distance determination, or an ultrasonic sensing system.

4. The system of claim 1, wherein modifying operation of the vehicle comprises modifying operation of a sensor system of the vehicle.

5. The system of claim 1, wherein compressing the video data is performed using forward error correction.

6. The system of claim 1, wherein compressing the video data is performed using a maximum separable distance erasure code.

7. The system of claim 1, wherein compressing the video data is performed using Cauchy Reed-Solomon code.

8. A method, comprising:
   obtaining video data via a video camera system mounted to a vehicle;
   obtaining distance map data via a distance mapping sensor system coupled to the vehicle;
   compressing the video data such that compressed video data is generated;
   compressing the distance map data using a compression algorithm such that compressed distance map data is generated;
   transmitting the compressed video data via a network to a virtual control system;
   transmitting the compressed distance map data via the network to the virtual control system;
   processing vehicle control instructions received, via the network, from the virtual control system; and
   modifying operation of the vehicle according to the vehicle control instructions.

9. The method of claim 8, the video camera system including a plurality of video cameras configurable to provide a 360-degree video feed.

10. The method of claim 8, wherein modifying operation of the vehicle comprises modifying operation of a sensor system of the vehicle.

11. The method of claim 8, wherein compressing the video data is performed using forward error correction.

12. The method of claim 8, wherein compressing the video data is performed using a maximum separable distance erasure code.

13. The method of claim 8, wherein compressing the video data is performed using Cauchy Reed-Solomon code.

14. A system, comprising:
   a video camera system mounted to a vehicle, the video camera system configurable to generate video data;
   a distance mapping sensor system coupled to the vehicle and configurable to generate distance map data;

a data processing system configurable to:
  compress the video data and distance map data,
  transmit the compressed video data and distance map data to a virtual control system via a network, and
  process vehicle control instructions received, via the network, from the virtual control system; and
a control system configurable to modify operation of the vehicle according to the vehicle control instructions.

15. The system of claim 14, the data processing system configurable to compress the video data using forward error correction.

16. The system of claim 14, the data processing system configurable to compress the video data using a maximum separable distance erasure code.

17. The system of claim 14, the data processing system configurable to compress the video data using Cauchy Reed-Solomon code.

18. The system of claim 14, the video camera system including a plurality of video cameras configurable to provide a 360-degree video feed.

19. The system of claim 14, the distance mapping sensor system comprising at least one of a lidar system, a radar system, a stereo imaging system for distance determination, a monocular system for distance determination, or an ultrasonic sensing system.

20. The system of claim 14, the data processing system further configurable to:
  prioritize video frames of the video data prior to compressing the video data.

* * * * *